US008122311B2

(12) United States Patent
Swoboda

(10) Patent No.: US 8,122,311 B2
(45) Date of Patent: Feb. 21, 2012

(54) APPARATUS AND METHOD FOR CLOCK SIGNAL SYNCHRONIZATION IN JTAG TESTING IN SYSTEMS HAVING SELECTABLE MODULES PROCESSING DATA SIGNALS AT DIFFERENT RATES

(75) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/007,278

(22) Filed: Jan. 14, 2011

(65) Prior Publication Data

US 2011/0113310 A1 May 12, 2011

Related U.S. Application Data

(63) Continuation of application No. 12/004,890, filed on Dec. 21, 2007, now abandoned.

(51) Int. Cl.
*G01R 31/28* (2006.01)

(52) U.S. Cl. ............. 714/731; 714/744; 326/16; 326/93

(58) Field of Classification Search .................... 326/16, 326/93, 95, 96, 97; 327/99; 714/724–745
See application file for complete search history.

(56) References Cited

U.S. PATENT DOCUMENTS 5,357,146 A * 10/1994 Heimann ...................... 327/292
5,828,824 A * 10/1998 Swoboda ......................... 714/25

* cited by examiner

*Primary Examiner* — Shawki S Ismail
*Assistant Examiner* — Jany Tran
(74) *Attorney, Agent, or Firm* — Mima Abyad; Wade J. Brady, III; Frederick J. Telecky, Jr.

(57) ABSTRACT

In a test and debug system in which a plurality of selectable modules under test have different operational rates, a selection unit associated with each module is used to control the application of the RCLK signal from the module to the combiner unit, the combiner unit providing a composite RCLK signal. Each selection unit has output signals of RCLK_NE and RCLK_PE signals which are applied to an combiner unit to form the composite RCLK signal. In response to the SELECT signal, the RCLK_NE and RCLK_PE are synchronized with the module RCLK signal. When the SELECT signal is removed, the RCLK_NE and RCLK_PE signals are continuously applied to the combiner unit.

15 Claims, 5 Drawing Sheets

APPARATUS AND METHOD FOR CLOCK SIGNAL SYNCHRONIZATION IN JTAG TESTING IN SYSTEMS HAVING SELECTABLE MODULES PROCESSING DATA SIGNALS AT DIFFERENT RATES

CROSS-REFERENCE TO RELATED APPLICATIONS

This application is a continuation of U.S. patent application Ser. No. 12/004,890 filed Dec. 21, 2007.

BACKGROUND OF THE INVENTION

This invention relates to the application of a system clock to a plurality of selectable modules that process the clock signals at different rates. In one example, the modules process test and debug signals, such as IEEE 1149.1 clock (and associated information), at different clock rates.

In certain processing units, different modules can process input signals at different clock rates. For example, modules of certain ARM Corporation processing units process test and debug signals at different rates depending on the module. In the JTAG test and debug format, not only is a clock (CLK) signal required, but a return clock (RCKL) signal must be present.

Referring to FIG. 1, a system having a plurality of modules processing data groups at different rates is illustrated. The processing system includes modules 1-N. Each module has a (system) CLK signal applied to an input terminal thereof. Each module processes data at a rate that is module-dependent. When the processing of the data is complete, the modules generate RCKL(1) through RCKL(N) signals. In FIG. 1, the application of test data in TDI(1) through test data in TDI(N) to the modules is illustrated. After processing, the test data out TDO(1) through test data out TDO(N) is retrieved from the modules. In the important JTAG example, the TDI (1) through the TDI(N) are applied, by means of a chain configuration, to the modules and the TDO(1) and TDO(N) are retrieved series format from the modules through a chain configuration. Consequently, it is necessary that the system clock signal be consistent with any of the RCLK(h) signals. Expressed in another manner, the TDI(k) are entered in the module, processed during a period of time determined by the design of the module, and retrieved from the modules for analysis.

As will be clear, either through failure of the system clock or as a result of variations in the time to process the data signals entered into each module, a timing error will occur.

In a typical test procedure, not all of the modules of the processing unit may be the subject of a particular test procedure. To include those modules might compromise the test procedure or reduce the speed with which the test and debug procedure can be performed.

It is therefore a feature of the apparatus and associated method to perform a test and debug procedure on selected modules of a processing system. It is yet another feature of the apparatus and associated method to determine when a return clock signal is not consistent with system clock signal during a test and debug procedure of processing unit having selectable modules. It is a more particular feature of the apparatus and associated method to generate return clock negative edge and positive edge signals for use in generating a composite RCL signal. It is yet another particular feature of the apparatus and associated method to apply RCLK_NE (Return clock negative) signal and RCLK_PE Return clock positive) signal from selected modules to an adder circuit, the RCLK_NE and RCLK_PE signals being synchronized with the module RCLK signal. It is still a further feature of the present invention to apply RCKL_NE and RCKL_PE signals continuously to the adder unit for the deselected modules. It is yet another particular feature of the present invention to provide a seamless transition between the selection and the deselection of a module.

SUMMARY OF THE INVENTION

The aforementioned and other features are accomplished, according to the present invention, by providing each module with a selection unit. In response to a SELECT signal, the selection unit will provide a RCLK_PE (RCLK POSITIVE EDGE) signal and a RCLK_NE (RCLK NEGATIVE CLOCK) signal to an combiner circuit, the RCLK_PE signals and the RCLK_NE signals being synchronized with the RCLK signal from the associated module. The RCLK_NE and RCLK_PE signals from the selected modules are combined to form a composite RCLK signal. For those modules for which the SELECTION signal is not applied, the RCLK_NE and RCLK_PE signals are continually applied to the combiner circuit. Because the RCLK_NE and the RCLK_PE signals from the non-selected modules are continuously applied to the combiner circuit, these modules do not participate in the generation of the composite RCLK signal, with only the selected modules contributing to the formation of the composite RCLK signal. The composite RCLK signal is compared with the CLK signal to identify timing problems in the (selected) modules.

DESCRIPTION OF THE PREFERRED EMBODIMENT

In certain system and chip configurations, different modules can process input signals at different rates or clock rates. For example, modules including certain ARM Corporation processing units process test and debug signals at rates determined by the functional clock of the module. With these modules the rate of processing input signals is therefore determined by the module instead of a rate by the clock supplied to the module. A change in the state of the clock (CLK) signal provided to the module initiates actions within the module, with the module generating a return a signal of to indicate the module has completed the action. In some implementations this signal is called a return clock (RCLK) Each change in state of the CLK signal creates a corresponding change in state of RCLK at some later time. Correct operation of the module requires that a change in state of the CLK signal occur only after the RCLK response. In some implementations this means CLK and RCLK signal must be in the same state before a change in the state of the CLK signal is permitted.

When multiple modules (1-N) are connected in parallel or series configuration on a board or chip, the next change in state of CLK signal must be governed by the last module responding to the prior change in state of the CLK signal. In other words, all modules that respond to a change in state the CLK signal and indicate this response with their local RCLK signal. The receipt of all local RCLK responses causes a corresponding change in state of a global RTCK signal returned to the logic generating CLK occurs. This assures the module with the slowest response to the CLK signal governs the point at which changes in the next change in state CLK may occur.

Figure 1:
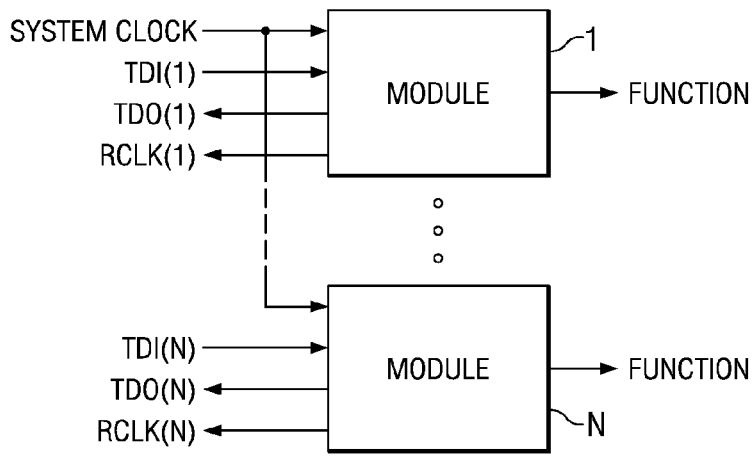
FIG. 1 is a block diagram of a system having a plurality of modules processing data signals at different rates according to the prior art.

Referring to FIG. 1, a system having a plurality of modules processing data groups at different rates is illustrated. The processing system includes modules 1-N. Each module has a (system) CLK signal applied to an input terminal thereof. Each module reacts to the changes in state of the CLK signal at its own pace (i.e. according to its own internal clock). When the processing of the data associated with the CLK signal is complete, the modules generate RCLK(1) through RCLK(N) signals. The exchange of test data in and test data out (TDI(1) and TDO(1) through (TDI(N) and TDO(N) is also illustrated in this figure. Changes in the state of the CLK signal cause the input and output of this data.

In the important 1149.1 example, the logic sourcing CLK presents data to the modules via the TDI(1) through the TDI(N) signals and the modules present data to the logic sourcing CLK via the and the TDO(1) and TDO(N) signals. The logic sourcing the CLK signal restricts changes in the state of this signal to a time after the acknowledgment of the previous change in state of the CLK signal. This ensures the correct exchange of data.

Without this pacing mechanism, an incorrect exchange of data would likely occur in the case where the logic state of the CLK signal changes when the state of all of the RCLK(h) signals is not the same (all responses to the last change in state of the CLK signal have hot occurred). A failure of the circuit generating the CLK signal or the use of a fixed frequency CLK signal together with variations in the time to process the changes in state of the clock signal entered into each module create a timing error that compromises the transmitted or retrieved data.

In a typical use, not all of the modules within the system or chip may be the subject of a particular test or other procedure. To include those modules might compromise the manner in which the procedure operates or reduce the speed with which the procedure can be performed.

It is therefore a feature of the apparatus and associated method to perform a procedure on a subset of the modules within the chip or system selected modules of a processing system. It is yet another feature of the apparatus and associated method to determine when the sequence of CLK edges and RCLK responses is incorrect. It is a more particular feature of the apparatus and associated method to generate return clock negative edge and positive edge signals for use in generating a composite RCLK signal. It is yet another particular feature of the apparatus and associated method to incorporate the selection of a module into signals used to generate a composite RCLK signal in a manner that excludes the delected module from determining when the RCLK signal is generated in response to a change in state of the CLK signal. It is yet another particular feature of the present invention to provide a seamless transition between the selection and the deselection of a module and the generation of the RCLK signal in response to a change in state of the CLK signal.

Figure 2:
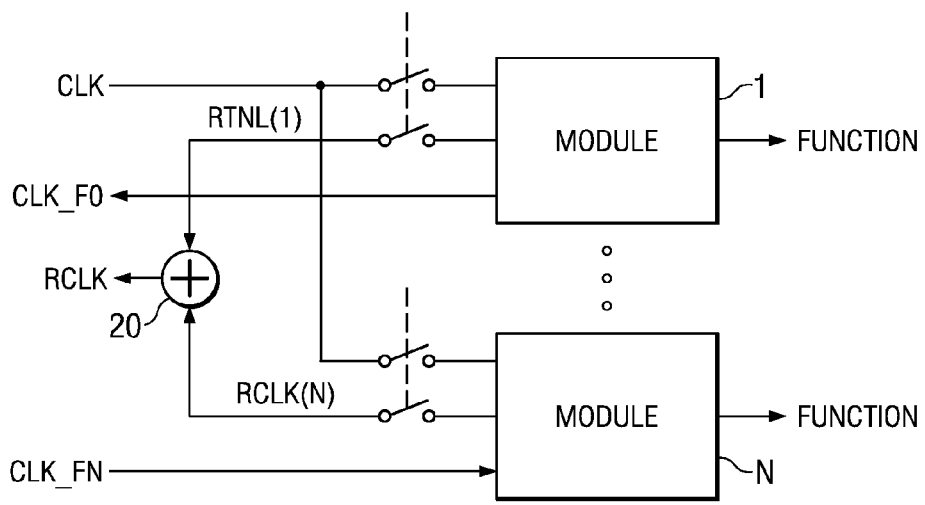
FIG. 2 is a block diagram for generating a composite RCLK signal for a system having a plurality of modules processing data signals at different rates according to the present invention.

Referring to FIG. 2, a block diagram of the present invention is shown. As in FIG. 1, module 1 through module N process input data signals TDI(1) through TDI(N), respectively, at different processing rates. In the preferred embodiment, the TDI(1) through TDI(N) are shifted into the modules through a serial path. After processing, the output data signals TDO(1)-TDO(N) from the modules 1-N are transmitted to a host processing unit of analysis. A system clock CLK signal is applied to each of the modules 1-N. Each module 1-N also receives a clock signal CLK_FN. The RCLK(1) through RCLK(N) signals from the modules 1-N are applied to combiner circuit 20. The output signal from the combiner circuit 20 is a composite RCLK signal.

Figure 3:
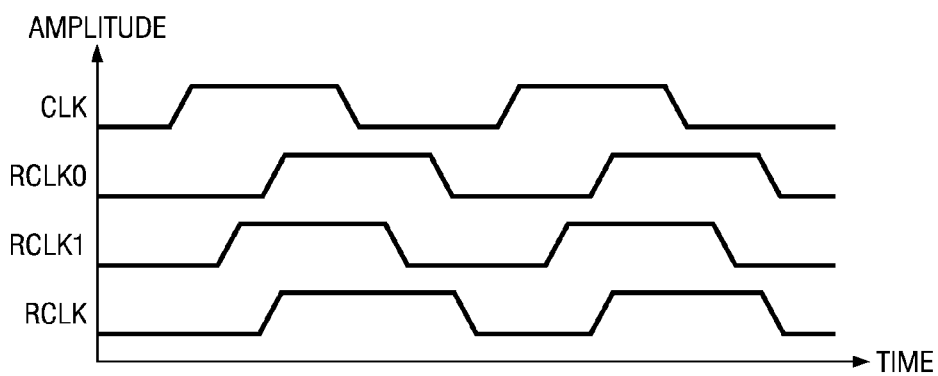
FIG. 3 illustrates the waveforms generated by the circuit of FIG. 2.
Figure 4:
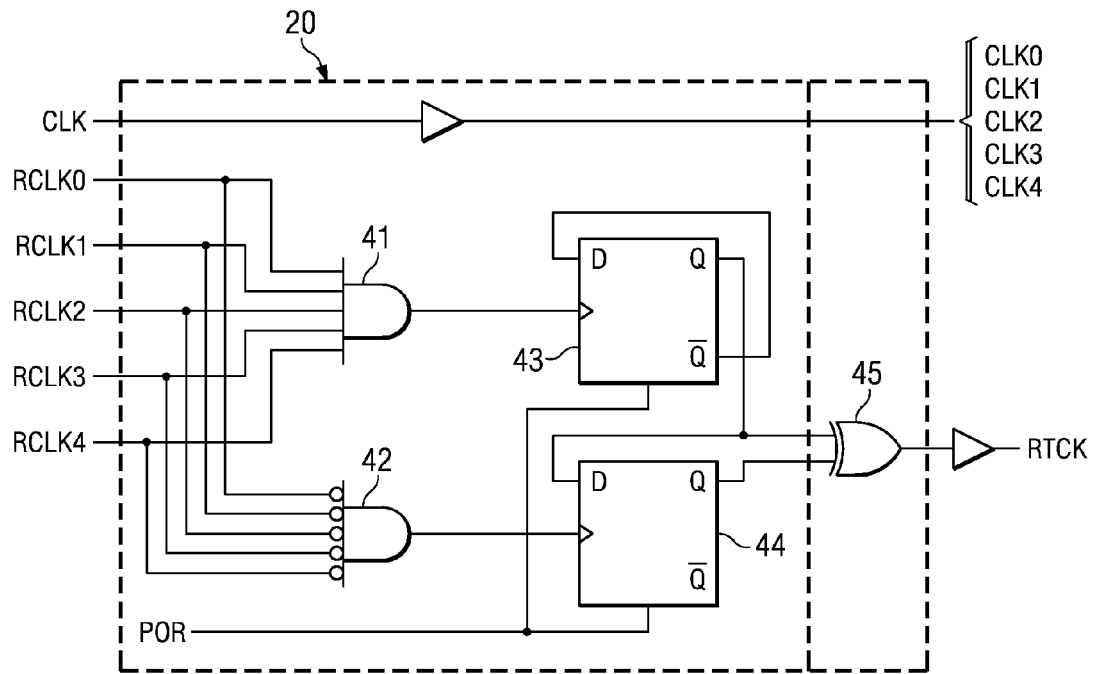
FIG. 4 is a circuit diagram showing an implementation of a combiner circuit for generating a RCLK signal suitable for use in FIG. 2.

Referring to FIG. 3, the technique for providing a composite RCLK signal from a plurality of RCLK(k) signals is illustrated. In FIG. 4, two RCLK signals RCLK0 and RCLK1 are used to illustrate how the RCLK signals are combined. The composite RCLK signal does not change to a logic value until each of the component RCLK0 and RCLK1 signals have achieved this value. The logic signal is maintained or latched until both the RCLK0 and the RCLK1 signals have both obtained the complementary logic state. At this time, the composite RCLK signal changes to the complementary logic value. The complementary logic value in maintained until the component RCLK0 and RCLK1 both have returned to the return to the original logic state.

Referring to FIG. 4, an implementation of the combiner circuit 20 of FIG. 2, providing the waveforms shown in FIG. 3, is shown. In the example of FIG. 4, four modules are assumed to be present. The RCLK(1) through RCLK(4) signals are applied to I of logic AND gate 41 and these same signals are applied to inverting terminals of logic AND put terminals of logic AND gate 42. The output terminal of logic AND gate 41 is applied to the clock terminal of DQ flip-flop 43. The output terminal of logic AND gate 44 is coupled to the clock terminal of DQ flip-flop 43. A POR (Power On Reset) signal is applied to the Reset terminals of logic ADD gate 43 and to the reset terminal of logic ADD gate 44. The Q' terminal of DQ flip-flop 43 is applied to the D terminal of DQ flip-flop 43. The Q terminal of DQ flip-flop 43 is applied to the D terminal of DQ flip-flop 44 and to a first input terminal of exclusive OR gate 45. The Q terminal of DQ flip-flop 44 is applied to a second input terminal of exclusive OR gate 45. The output signal of exclusive OR gate is transmitted through a buffer 46 to become the RTCK signal. FIG. 4 also indicates that the CLK signal is the CLK signal for the modules 1 through 4.

Figure 5:
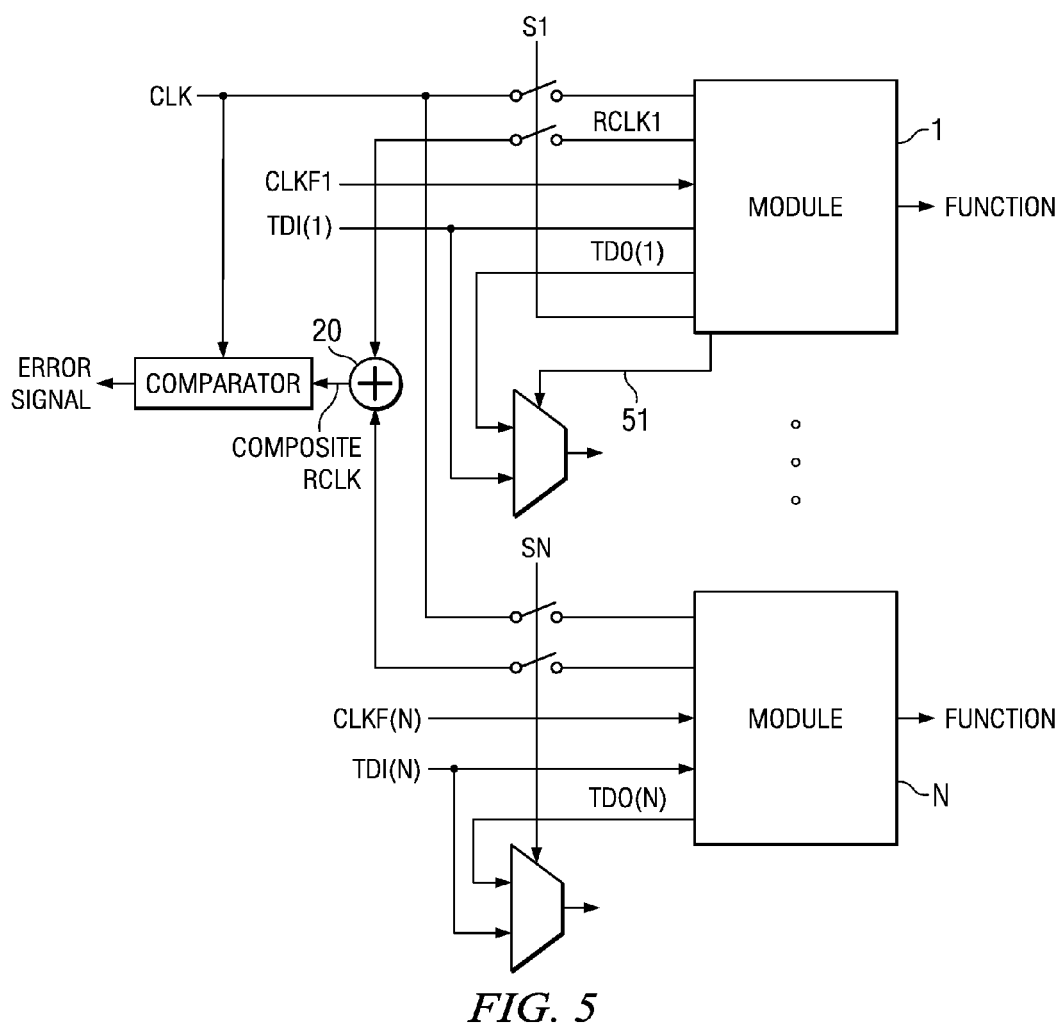
FIG. 5 is a block diagram of a test and debug system with selectable modules according to the present invention.

Referring to FIG. 5, the block diagram shown in FIG. 2 has been modified to provide for selectable modules. In addition to the clock signals, the data stream must similarly be controlled. The TDO(k) from the $k^{th}$ module must be prohibited from reaching the host processor when the $k^{th}$ module is not selected. Each module k has switch Sk associated therewith. The switch Sk, when closed, applies clock CLK signal to the module k and applies the RCLK(k) to the combiner 20. Each module k has a multiplexer 4k associated therewith. Each multiplexer 4k has the TDI(k) signal applied to one input terminal, the TDI(k) signal also being applied to an input terminal of module k. The second input terminal of multiplexer 4k has the TDO(k) signal from module k applied thereto. The signals which activate the switches Sk also provide the control signals for the multiplexer 4k. The clock signal CLK_Fk is also applied to module k. The output signals from the selection unit are applied to comparator 55. The comparator determines when the composite RCLK signal and the CLK signal are consistent.

Figure 6:
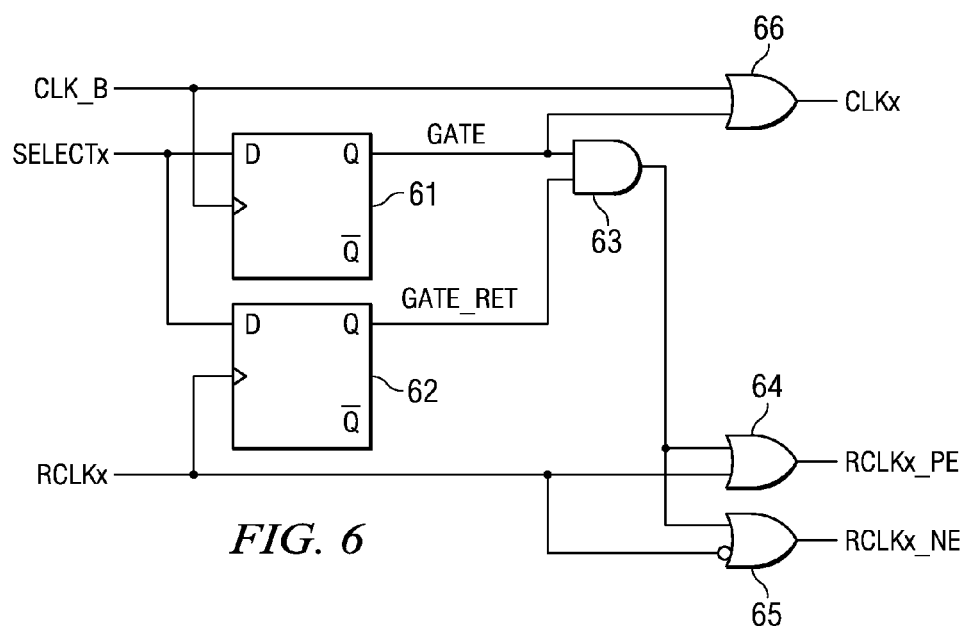
FIG. 6 is a schematic diagram of the selection circuit associated with each module according to the present invention.

Referring next to FIG. 6, the circuit for selecting a particular module x is shown. A select control signal is applied to the D terminal of DQ flip flop 61 and to a D terminal of DQ flip-flop 62. The CLK_B signal is applied to the clock terminal of DQ flip-flop 61 and to a first input terminal of logic OR gate 66. The Q terminal of DQ flip-flop 61 is applied to a second input terminal logic OR gate 66 to a first input terminal of logic AND gate 63. The Q terminal of DQ flip-flop 63 is applied to a second input terminal of logic AND gate 63. The output terminal of logic AND gate 63 is applied to a second input terminal of logic OR gate 64 and to a second input terminal of logic OR gate 65. The RCLKx signal is applied to the clock terminal of DQ flip-flop 62, to a first input terminal of logic OR gate 64 and to an inverting first terminal of logic OR gate 65. The output terminal of logic OR gate 66 provides the CLKx signal. The output terminal of logic OR gate 64 provides the RCLKX_PE (positive edge) signal, and the output terminal of logic OR gate 65 provides the RCLKx_NE (negative edge) signal.

Figure 7:
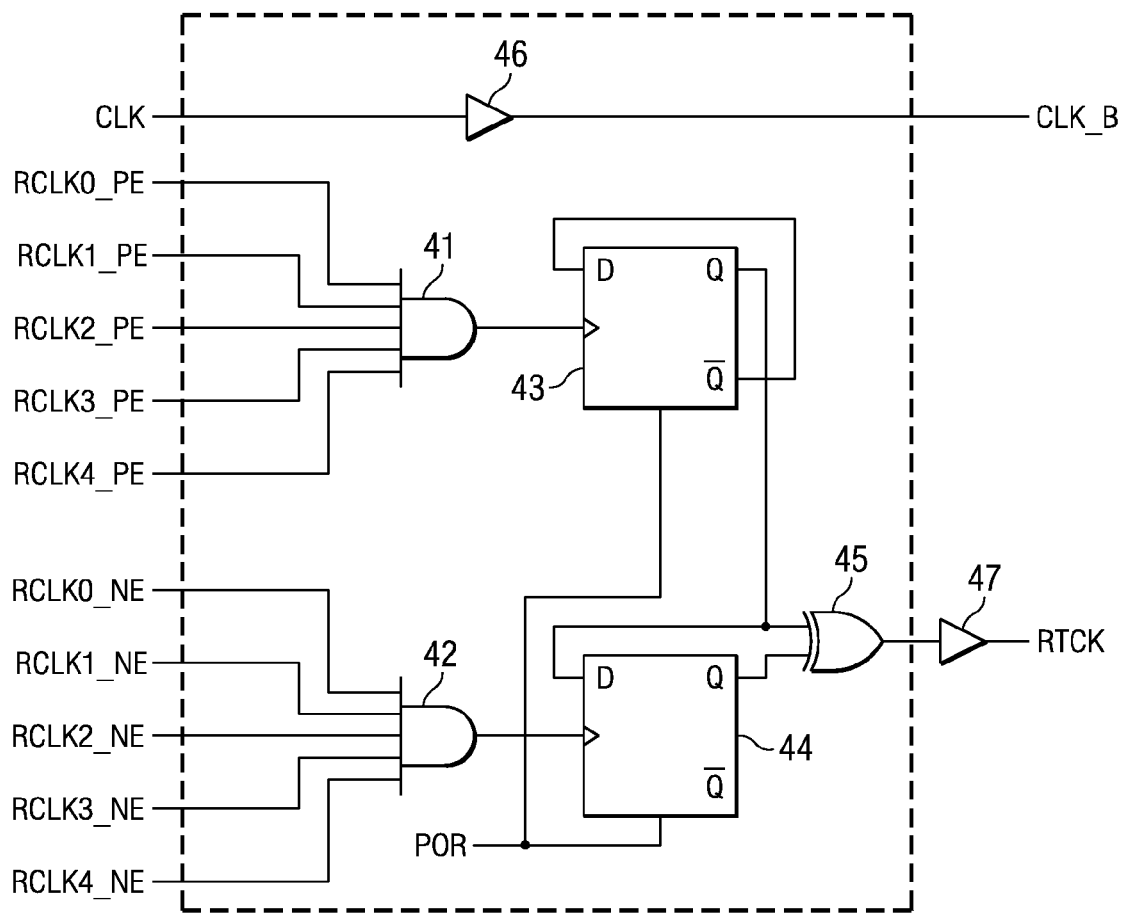
FIG. 7 is a schematic diagram of the combiner circuit when POSITIVE EDGE and NEGATIVE EDGE signals re applied to the combiner circuit according to the present invention.

Referring to FIG. 7, the circuit shown in FIG. 4 is redrawn showing the use of positive edge signals and negative edge signals of the RCLKx signals in order to activate the RCLK signals.

Figure 8:
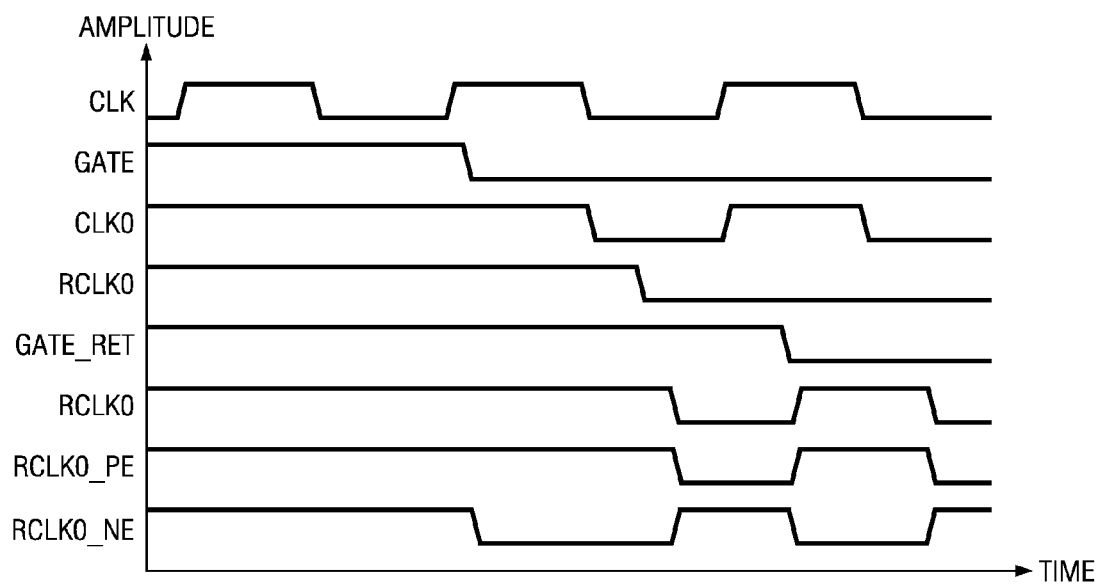
FIG. 8 illustrates the waveforms in the selection unit of FIG. 6 when the SELECT signal is applied according to the present invention.
Figure 9:
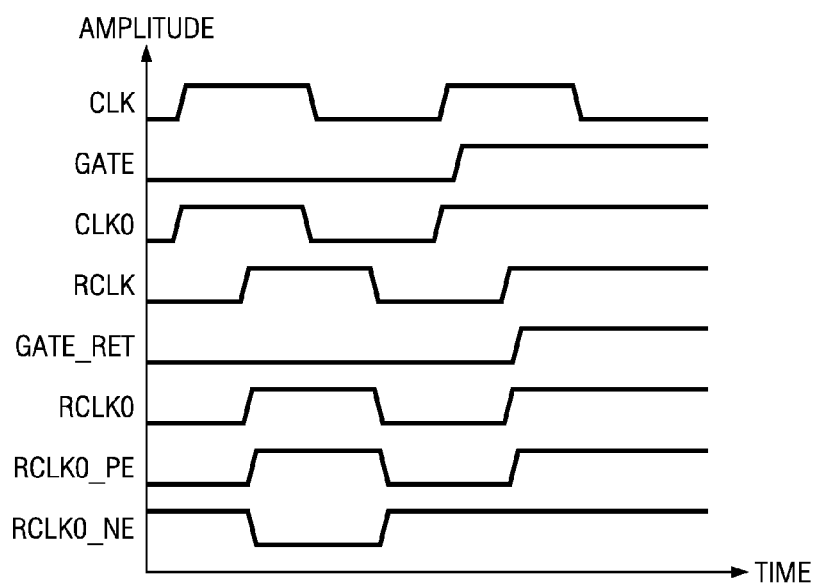
FIG. 9 illustrates the waveforms in the selection unit of FIG. 6 when the SELECT signal is removed according to the present invention.

Referring to FIG. 8, the signals for the selection network shown in FIG. 6 are illustrated for the situation wherein the SELECT signal is applied thereto. When the SELECT signal is applied to the associated switch Sx, the RCLKx signal participates in generation of the composite RCLK signal. When the In FIG. 9 illustrates the waveforms of FIG. 6 when SELECT signal is removed, the module is deselected from influencing the generation of the composite RCLK signal from combiner 20.

The operation of the present invention can be understood as follows. The comparison of an input clock signal with RCLK signals from a plurality of modules processing data signals at different rates can provide a method for determining an actual or potential malfunction in the test and debug procedure. In the present invention, modules in the system can be selected or deselected, i.e., each module can be selectively included in the test procedure. A selection unit is coupled to each module. A control signal is used to include the coupled module or not include the coupled module in the test procedure. When a module is selected, the RCLK_PE and RCLK_NE signals are synchronized with the positive and negative edges of the corresponding RCLK signal. The output signals from the selection unit are applied to the combiner unit, the output of the combiner unit being a composite RCLK signal for all of the selected modules.

When a module is not selected, i.e., the control signal is not applied, the selection unit provides continuous RCLK_PE and RCLK_NE signals to the combiner unit. Because these signals are always present, the signals do not affect the output of the combiner unit. Only the selected modules contribute to the composite RCLK signal.

In the comparator circuit, when the composite RCLK signal is and the system CLK signal have the same logic value, an ERROR signal is generated. This ERROR signal indicates, for example, that a module is being directed to accept test data in, TDI, before the correct test data out, TDO, has been presented by the module. Other malfunctions such as a system CLK malfunction can also be detected.

While the invention has been described with respect to the embodiments set forth above, the invention is not necessarily limited to these embodiments. Accordingly, other embodiments, variations and improvements not described herein are not necessarily excluded from the scope of the invention, the scope of the invention being defined by the following claims.

What is claimed is:

1. A testing system, comprising:
    a plurality of modules operating at different rates;
    a selection unit for selecting one of the plurality of modules; and
    at least one combiner unit responsive to the selection of the selection unit, wherein the at least one combiner unit manages at least one of the selection and deselection of the module at the operating rate of the module, wherein the testing system indicates the completion of an operation with a return clock signal created from a composite of RCLKx signals created by the at least one module.

2. The testing system of claim 1, wherein the plurality of modules are responsive to a system clock signal, and provide an indication completion of an operation with at least one of an operation status signal, a return clock signal, and ready signal.

3. The testing system of claim 1, wherein the testing system is responsive to a system clock signal, and provides an indication completion of an operation with at least one of ready signal and information embedded in a bit stream.

4. The combiner unit of claim 1, wherein the combiner unit manages the at least one module creating a completion indication in response to the selection of the selection unit by creating a complete indication for a module when the module is deselected and uses the completion indication generated by the module activity when the module is selected.

5. The combiner unit of claim 1 wherein the at least one module indicates completion of an operation with a return clock signal, wherein the return clock signals generate a system's operation complete indication, wherein the combiner unit is responsive to a system clock signal and selection signal created by the selection unit, the combiner unit expanding the module's return clock signal into a Return Clock Positive (RCLK_PE) signal and a Return Clock Negative (RCLK_NE) signal to create a composite ready to proceed indication.

6. The combiner unit of claim 5, wherein the selection and deselection of the selection unit is induced changes in the RCLK_PE signal and RCLK_NE signal are generated in synchronism with the RCLK signal.

7. The combiner unit of claim 1, wherein a RCLK_PE signal and RCLK_NE signal continuously indicate completion.

8. The combiner unit of claim 1, wherein the selection of the selection unit indicates a module is ready to proceed when the module is deselected and indicates the module is ready to proceed after the module's processing of an input when the module is selected.

9. The selection unit of claim 1, wherein the test system comprises a JTAG format.

10. A method of a processor for applying a module RCLK signal to a combiner unit to form a composite RCLK signal, the method comprising:
    applying a RCLK_NE signal and a RCLK_PE signal synchronized with the module's RCLK signal when a select signal is applied; and applying a RCLK_NE signal and a RCLK_PE signal continuously when a SELECT signal is not applied.

11. The method of claim 10 further comprising comparing the composite RCLK signal and the CLK signal.

12. The method of claim 11 further comprising generating an ERROR signal when the CLK signal and the RCLK signal have a preselected relationship.

13. An apparatus for generating a composite RCLK signal, the apparatus comprising:
- a plurality of modules for processing data in signals at different rates;
- a combiner unit for generating a composite RCLK signal for a selected module;
- a selection unit coupled to each module, the selection unit having the RCLK signal from the coupled module applied thereto, the selection unit applying RCLK_PE and RCLK_NE signals synchronized with the RCLK signal to the combiner unit when a control signal is applied to the selection unit, the selection unit applying continuous RCLK_PE and RCLK_NE signals to the combiner unit when the first control signal is not applied to the selection unit.

14. The apparatus as recited in claim 13 further comprising a comparator, the comparator comparing the CLK signal and the composite RCLK signal, the comparator generating an ERROR signal when the CLK signal and the RCLK signal have a preselected relationship.

15. The apparatus as recited in claim 14 wherein the ERROR signal is generated when the composite RCLK signal transitions to the same logic state as the CLK signal.

* * * * *